US 9,257,271 B2

(12) United States Patent
Ueda (10) Patent No.: US 9,257,271 B2
(45) Date of Patent: Feb. 9, 2016

(54) SEMICONDUCTOR DEVICE MANUFACTURING METHOD, SUBSTRATE PROCESSING APPARATUS, AND NON-TRANSITORY RECORDING MEDIUM

(71) Applicant: HITACHI KOKUSAI ELECTRIC INC., Tokyo (JP)

(72) Inventor: Tatsushi Ueda, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 320 days.

(21) Appl. No.: 13/826,599

(22) Filed: Mar. 14, 2013

(65) Prior Publication Data

US 2013/0252433 A1     Sep. 26, 2013

(30) Foreign Application Priority Data

Mar. 26, 2012   (JP) .................................. 2012-68850

(51) Int. Cl.
  *H01L 21/306* (2006.01)
  *C23C 16/56* (2006.01)
  *H01L 21/02* (2006.01)

(52) U.S. Cl.
  CPC .......... *H01L 21/02104* (2013.01); *C23C 16/56* (2013.01); *H01L 21/0234* (2013.01); *H01L 21/02332* (2013.01); *H01L 21/306* (2013.01)

(58) Field of Classification Search
  None
  See application file for complete search history.

(56) References Cited

U.S. PATENT DOCUMENTS

| 7,883,632 | B2 | 2/2011 | Honda et al. |
| 7,902,050 | B2 * | 3/2011 | Sato et al. .................... 438/485 |
| 8,471,477 | B2 | 6/2013 | Tomita et al. |
| 8,658,522 | B2 | 2/2014 | Sato et al. |
| 2003/0109134 | A1 * | 6/2003 | Yuzuriha ....................... 438/680 |
| 2006/0099771 | A1 * | 5/2006 | Chen ................. H01L 21/76232 438/424 |
| 2010/0239781 | A1 * | 9/2010 | Sano et al. .................... 427/569 |
| 2012/0202355 | A1 * | 8/2012 | Sugino et al. ................. 438/765 |
| 2012/0329239 | A1 * | 12/2012 | Kammler .......... H01L 21/76224 438/424 |

FOREIGN PATENT DOCUMENTS

| JP | 10-046372 A | 2/1998 |
| JP | 2006-005287 A | 1/2006 |
| KR | 1020070095806 A | 10/2007 |
| KR | 1020080014073 A | 2/2008 |
| KR | 1020110108278 A | 10/2011 |

OTHER PUBLICATIONS

Korean Office Action with English Translation, Korean Patent Appln. No. 10-2013-0031637, Feb. 28, 2014, 15 pp.

* cited by examiner

*Primary Examiner* — Anita Alanko
(74) *Attorney, Agent, or Firm* — Volpe and Koenig, P.C.

(57) ABSTRACT

A method of manufacturing a semiconductor device includes: accommodating a substrate having an oxide film formed thereon into a processing chamber; supplying a process gas to the substrate; performing a preprocessing step in which the process gas is excited in a state that a pressure within the processing chamber is kept at a first pressure and an electric potential of the substrate is kept at a first electric potential; and performing a main processing step by which the process gas is excited in a state that the pressure within the processing chamber is kept at a second pressure and the electric potential of the substrate is kept at a second electric potential, wherein the first pressure is lower than the second pressure and the first electric potential is lower than the second electric potential.

6 Claims, 7 Drawing Sheets

SEMICONDUCTOR DEVICE MANUFACTURING METHOD, SUBSTRATE PROCESSING APPARATUS, AND NON-TRANSITORY RECORDING MEDIUM

CROSS-REFERENCE TO RELATED APPLICATION

This application is based upon and claims the benefit of priority from Japan Patent Application No. 2012-068850, filed on Mar. 26, 2012, the entire contents of which are incorporated herein by reference.

TECHNICAL FIELD

The present disclosure relates to a substrate processing apparatus such as a CVD (Chemical Vapor Deposition) processing apparatus, and a substrate processing method or a semiconductor device manufacturing method using the substrate processing apparatus. For example, embodiments of the present disclosure may pertain to a substrate processing apparatus, a substrate processing method and a semiconductor device manufacturing method, which can uniformly process a plurality of substrates such as semiconductor wafers (hereinafter referred to as "wafer") and the like when the substrates are continuously processed through the use of plasma.

BACKGROUND

As a method of processing the surface of a wafer or the like, plasma processing is carried out. As an apparatus for the plasma processing, there is used, e.g., a wafer-by-wafer processing apparatus in which a single wafer is loaded into and processed within a processing chamber every time a wafer is processed. In the wafer-by-wafer processing apparatus, in order to stabilize a gas concentration and a temperature within the processing chamber at the wafer processing startup time, a method is used in which a number of dummy wafers (distinguished from product wafers) for use in the production of semiconductor chips are continuously processed (preprocessing) and then the product wafers are processed (main processing). In some cases, if the product wafers are subjected to nitriding during the main processing without performing the preprocessing using the dummy wafers, the number of initially processed product wafers may have a low nitrogen concentration. Bare silicon substrates are generally used as the dummy wafers.

In order to reduce metal contamination when starting up an apparatus, plasma discharge is performed while supplying a nitrogen gas into a processing chamber when a wafer is not placed on a susceptor installed inside the processing chamber. The internal pressure of the processing chamber during the plasma discharge is kept lower than the pressure during the plasma processing of product wafers. If the internal pressure of the processing chamber during the plasma discharge is kept low, the impact forces of electrons or ions grow larger. Metallic contaminants adhering to those members arranged within the processing chamber are easily removed and discharged from the processing chamber.

In the conventional product substrate processing method, when a product substrate having an oxide film formed on the surface thereof is subjected to nitriding, there is a need to preliminarily nitride a multiple number of dummy substrates having an oxide film formed on the surface thereof.

SUMMARY

Some embodiments of the present disclosure provide a substrate processing technology capable of reducing the number of dummy substrates required in conventional preprocessing.

According to one aspect of the present disclosure, there is provided a method of manufacturing a semiconductor device, including: accommodating a substrate having an oxide film formed thereon into a processing chamber; supplying a process gas containing nitrogen atoms to the substrate; preprocessing by which the process gas is excited in a state that a pressure within the processing chamber is kept at a first pressure and an electric potential of the substrate is kept at a first electric potential; and main processing by which the process gas is excited in a state that the pressure within the processing chamber is kept at a second pressure lower than the first pressure and the electric potential of the substrate is kept at a second electric potential lower than the first electric potential.

According to another aspect of the present disclosure, there is provided a substrate processing apparatus, including: a processing chamber configured to accommodate a substrate having an oxide film formed thereon; a gas supply unit configured to supply a nitrogen-containing process gas to the substrate accommodated within the processing chamber; a plasma generating unit configured to excite the process gas; a substrate potential changing unit configured to change an electric potential of the substrate; and a control unit configured to control the gas supply unit, the plasma generating unit and the substrate potential changing unit so as to perform: preprocessing by which the process gas is excited in a state that an inside of the processing chamber is kept at a first pressure and an electric potential of the substrate is kept at a first electric potential; and a main processing by which the process gas is excited in a state that the inside of the processing chamber is kept at a second pressure lower than the first pressure and the electric potential of the substrate is kept at a second electric potential lower than the first electric potential.

According to a further aspect of the present disclosure, there is provided a recording medium for recording a program used in causing a computer to execute: a procedure for accommodating a substrate having an oxide film formed thereon into a processing chamber; a procedure for supplying a process gas to the substrate; a preprocessing procedure by which the process gas is excited in a state that a pressure within the processing chamber is kept at a first pressure and an electric potential of the substrate is kept at a first electric potential; and a main processing procedure by which the process gas is excited in a state that the pressure within the processing chamber is kept at a second pressure lower than the first pressure and the electric potential of the substrate is kept at a second electric potential lower than the first electric potential.

DETAILED DESCRIPTION

As stated above, if a product wafer obtained by forming an oxide film on the surface of a silicon substrate is subjected to nitriding, a phenomenon occurs in which i) the nitrogen concentration in the oxide film of the product wafer at the processing startup time immediately after the processing of a dummy wafer becomes higher, ii) the nitrogen concentration in the oxide film of the product wafer processed thereafter becomes lower, and iii) the nitrogen concentration gets stabilized after the process is performed several times. It was found that the above phenomenon occurs when the inside of the processing chamber is kept in an oxygen-free state by hydrogen plasma processing or the like after an idle state in which the product wafer is not processed is maintained for a long time or after the inside of the processing chamber is exposed to the atmosphere for maintenance purposes.

It appears that the decrease of the nitrogen concentration in the oxide film of the product wafer immediately after the processing of the dummy wafer is caused by the difference in the materials existing on the surfaces of the dummy wafer and the product wafer. In other words, it appears that the nitriding of the oxide film formed on the product wafer is performed through a reaction model in which the oxygen in the oxide film and the nitrogen in a gas are replaced with each other. In this case, the oxygen is ejected from the oxide film into the gas. The oxygen ejected from the oxide film formed on the surface of the product wafer in this manner adheres to the inner wall of the processing chamber in a large amount. Then, when the next product wafer is subjected to nitriding, the oxygen adhering to the inner wall of the processing chamber is ejected into the processing chamber. The concentration of the activated nitrogen in the gas within the processing chamber grows lower and the nitrogen concentration in the oxide film formed on the surface of the product wafer decreases.

The oxygen adhering to the inner wall of the processing chamber is difficult to remove in a typical gas replacement process. When the product wafer is subjected to nitriding, the oxygen comes out into the internal space of the processing chamber and gets into an oxynitride film formed on the product wafer. This poses a problem in that the oxygen affects the properties of the oxynitride film. On the other hand, even if a dummy wafer as a bare silicon substrate is subjected to nitriding, no oxygen is ejected. Therefore, even when preprocessing is performed with the dummy wafer as a bare silicon substrate, the inner wall of the processing chamber is kept in an oxygen-free state. For that reason, if main processing is started with the product wafer having an oxide film, the oxygen adhering to the inner wall of the processing chamber increases. This poses a problem in that it becomes impossible to perform uniform nitriding with respect to the product wafer.

Under these circumstances, the present inventors have conceived a method in which, using a dummy wafer having an oxide film formed on the surface thereof, preprocessing is performed under the same process conditions as those of the product wafer processing (main processing). This method provides improvements over the conventional method in which a bare silicon substrate is used as a dummy wafer. However, a multiple number of dummy wafers each having an oxide film needs to be processed until the nitrogen concentrations in the oxide films of the wafers become substantially constant.

Figure 6:
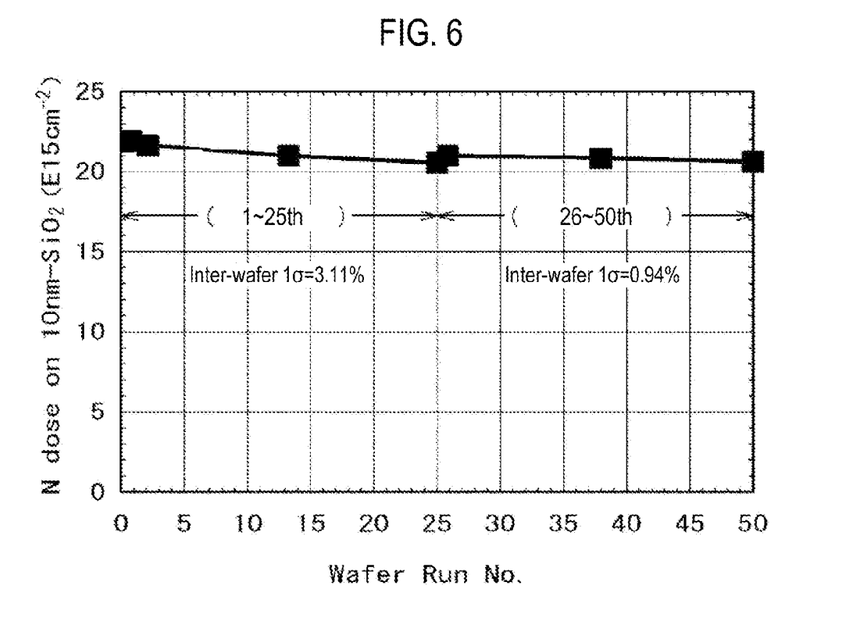
FIG. 6 is a view showing the content of nitrogen injected into an oxide film when the wafers each having an oxide film formed on the surface thereof are continuously subjected to nitriding according to a conventional method.

FIG. 6 is a view showing the content of the nitrogen injected into the oxide film when the wafers each having an oxide film formed on the surface thereof are continuously subjected to nitriding. In FIG. 6, the vertical axis indicates a nitrogen dose amount, i.e., the number of nitrogen atoms injected into the oxide film ($1\times10^5/cm^2$). The horizontal axis indicates the run numbers of the product wafers processed. The run numbers are given in a processing order. In the example shown in FIG. 6, dummy processing (preprocessing) is performed with five silicon wafers each having a 10 nm-thick oxide film ($SiO^2$) formed on the surface thereof. Thereafter, one to fifty product wafers are processed (main processing). An oxygen-free atmospheric state can be realized by, e.g., hydrogen plasma processing. As shown in FIG. 6, the inter-wafer standard deviation ($1\sigma$) in the nitrogen dose amount is 3.11% with respect to the first to twenty fifth product wafers and 0.94% with respect to the twenty sixth to fiftieth product wafers. In the conventional method, about twenty five to fifty product wafers need to be subjected to nitriding until the nitrogen dose amount is gradually decreased and settled down. The dummy wafers subjected to preprocessing are nitrided and, therefore, cannot be reused. This poses a problem in that the cost becomes higher. The technology described in the subject specification can solve the problems noted above.

First Embodiment (1) Configuration of Substrate Processing Apparatus

Figure 1:
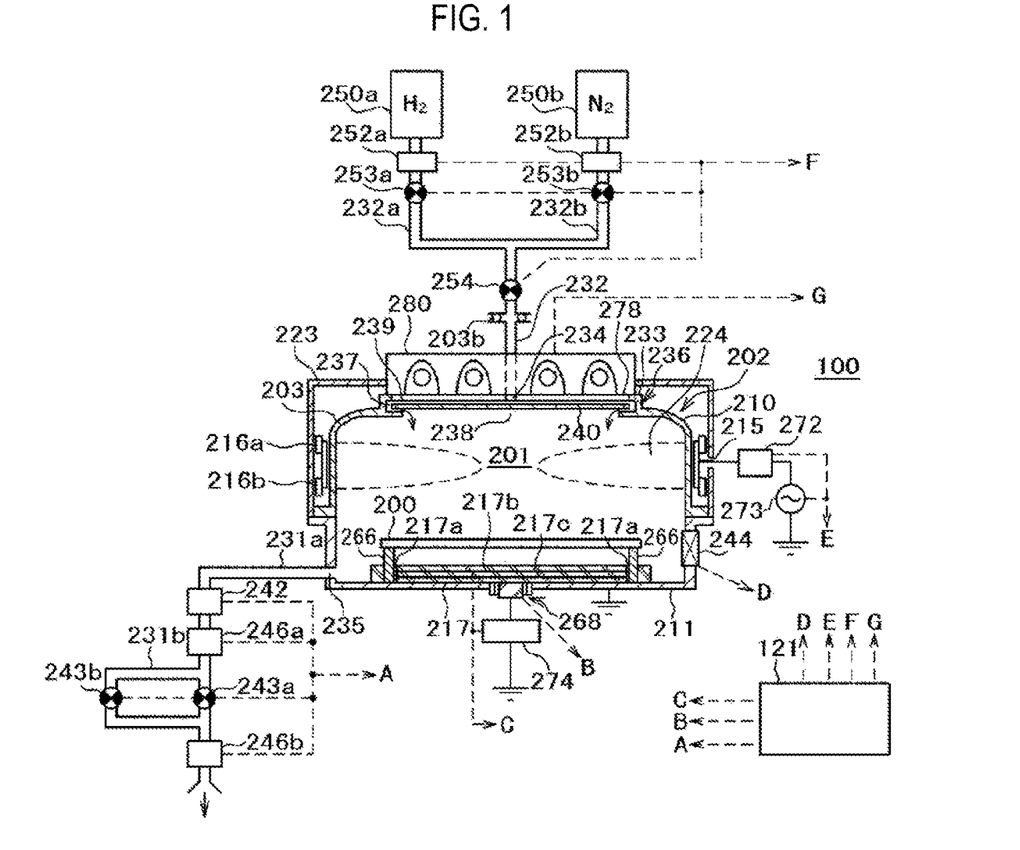
FIG. 1 is a vertical section view of an MMT plasma processing apparatus according to a first embodiment of the present disclosure, showing a state that a substrate is being loaded.
Figure 2:
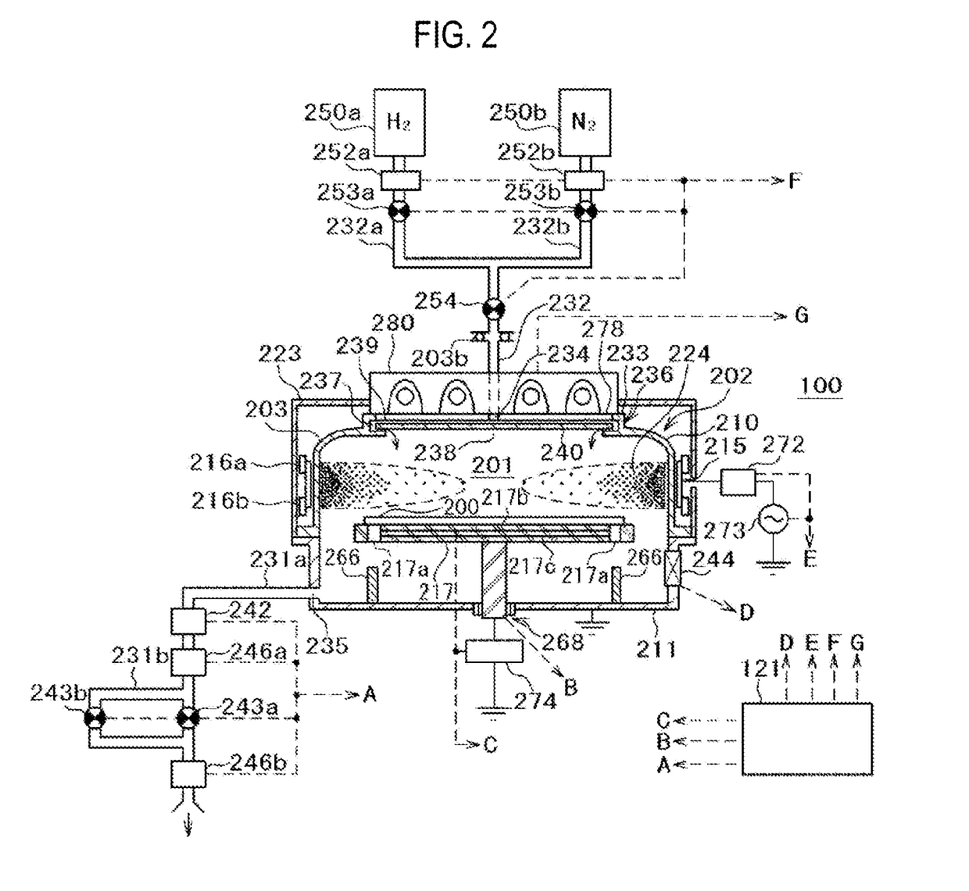
FIG. 2 is a vertical section view of the MMT plasma processing apparatus according to the first embodiment of the present disclosure, showing a state that the substrate is being processed.

A substrate processing apparatus according to a first embodiment of the present disclosure will now be described with reference to FIGS. 1 and 2. FIGS. 1 and 2 show a modified magnetron type plasma processing apparatus as the substrate processing apparatus according to the first embodiment. FIG. 1 is a section view showing a state that a substrate is being loaded. FIG. 2 is a section view showing a state that a substrate is being processed.

The substrate processing apparatus according to the first embodiment is a modified magnetron type plasma processing apparatus (hereinafter referred to as "MMT apparatus") that plasma-processes a wafer 200 such as a silicon (Si) substrate or the like through the use of a modified magnetron type plasma source for generating high-density plasma with electric fields and magnetic fields. The MMT apparatus 100 is configured to load the wafer 200 into a processing chamber 201 kept air-tight and to induce magnetron discharge by applying a high-frequency voltage to various kinds of gases supplied into the processing chamber 201 under a constant pressure. In the MMT apparatus 100, a relevant mechanism is used to excite, e.g., process gases, thereby performing different kinds of plasma processing, e.g., diffusion processing such as the oxidizing or nitriding of the wafer 200, the forming of a thin film or the etching of the surface of the wafer 200.
<Processing Chamber>

The MMT apparatus 100 includes a processing furnace 202 for plasma-processing the wafer 200. A processing vessel 203 making up the processing chamber 201 is provided in the processing furnace 202. The processing vessel 203 includes a dome-shaped upper vessel 210 as a first vessel and a bowl-shaped lower vessel 211 as a second vessel. The upper vessel 210 is covered on the lower vessel 211, thereby forming the processing chamber 201. The upper vessel 210 is made of a non-metallic material, e.g., aluminum oxide ($Al_2O_3$) or quartz ($SiO_2$). The lower vessel 211 is made of, e.g., aluminum (Al).

A gate valve 244 is provided in the lower side wall of the lower vessel 211. The gate valve 244 is configured such that, when the gate valve 244 is opened, the wafer 200 can be loaded into the processing chamber 201 through the use of a transfer mechanism (not shown) or the wafer 200 can be unloaded out of the processing chamber 201. The gate valve 244 is configured to serve as a gate valve that, when closed, keeps the inside of the processing chamber 201 air-tight.
<Susceptor>

A susceptor 217 for supporting the wafer 200 is arranged at the bottom center of the processing chamber 201. The susceptor 217 is made of a non-metallic material, e.g., aluminum nitride (AlN), ceramic or quartz, and is configured to reduce metal contamination of a film formed on the wafer 200.

A heater 217c as a heating mechanism is one-piece embedded in the susceptor 217. The heater 217c is configured to, when supplied with electric power, heat the surface of the wafer 200 to, e.g., about 25 to 700 degrees C.
<Substrate Potential Changing Unit>

The susceptor 217 is electrically insulated from the lower vessel 211. An impedance adjusting electrode 217b is mounted within the susceptor 217. The impedance adjusting electrode 217b is grounded via an impedance variable mechanism 274 as an impedance adjusting unit. The impedance adjusting electrode 217b serves as a second electrode against a tubular electrode 215 serving as a first electrode to be described later. The impedance variable mechanism 274 is formed of a coil and a variable capacitor and is configured to control the electric potential (bias voltage) of the wafer 200 through the impedance adjusting electrode 217b and the susceptor 217 by controlling the inductance and resistance of the coil and the capacitance of the variable capacitor. Thus, the impedance variable mechanism 274 makes up a substrate potential changing unit for changing the electric potential of the wafer 200.

A susceptor elevator mechanism 268 for lifting or lowering the susceptor 217 is provided in the susceptor 217. Through-holes 217a are formed in the susceptor 217. Wafer pushup pins 266 serving as a first substrate supporting unit are provided on the bottom surface of the lower vessel 211. The through-holes 217a and the wafer pushup pins 266 are provided in at least three positions in a mutually aligned relationship. As shown in FIG. 1, when the susceptor 217 is lowered by the susceptor elevator mechanism 268, the wafer pushup pins 266 extend through the through-holes 217a without making contact with the susceptor 217. Thus, the wafer 200 loaded into the processing chamber 201 is temporarily supported by the wafer pushup pins 266. As shown in FIG. 2, when the susceptor 217 is lifted by the susceptor elevator mechanism 268, the wafer 200 is transferred from the wafer pushup pins 266 to the susceptor 217. A second substrate support unit according to the present embodiment is mainly made up of the susceptor 217.

<Lamp Heater Unit>

A light transmitting window 278 is provided at the upper side of the processing chamber 201, namely on the upper surface of the upper vessel 210. A lamp heater unit 280 as a lamp heater device is provided above the light transmitting window 278 and outside the processing vessel 203. The lamp heater unit 280 is provided in such a position as to face the susceptor 217 and is configured to heat the wafer 200 from above the wafer 200. By energizing the lamp heater unit 280, it is possible to heat the wafer 200 more rapidly than the heater 217c. If the heater 217c is used in combination, it becomes possible to increase the temperature of the substrate surface to 900 degrees C.
<Gas Supply Unit>

A gas supply pipe 232 and a shower head 236 are provided above the processing chamber 201, namely above the upper vessel 210. The shower head 236 includes a cap-shaped lid 233, a gas inlet 234, a buffer room 237, an opening 238, a shield plate 240 and a gas outlet 239. The shower head 236 is configured to supply different kinds of gases into the processing chamber 201. The buffer room 237 is formed of a dispersion space for dispersing the gases introduced from the gas inlet 234.

The downstream end of a hydrogen-containing gas supply pipe 232a for supplying a hydrogen ($H_2$) gas as a hydrogen-containing gas and the downstream end of a nitrogen-containing gas supply pipe 232b for supplying a nitrogen ($N_2$) gas as a nitrogen-containing gas are merged at and connected to the gas supply pipe 232. A $H_2$ gas source 250a, a mass flow controller 252a as a flow rate control device and a valve 253a as an on-off valve are provided on the hydrogen-containing gas supply pipe 232a in the named order from the upstream side. A $N_2$ gas source 250b, a mass flow controller 252b as a flow rate control device and a valve 253b as an on-off valve are provided on the nitrogen-containing gas supply pipe 232b in the named order from the upstream side.

The hydrogen gas is used to adjust the nitrogen concentration within the processing chamber 201 and to enhance the nitriding efficiency of an oxide film formed on the substrate surface. The nitrogen gas is used as a nitriding gas, i.e., a reformed gas, for nitriding an oxide film formed on the product wafer or as an inert gas. In case where a nitrogen-containing gas incapable of being used as an inert gas, e.g., $NH_3$ gas, is used as the nitriding gas for nitriding the oxide film, an inert gas supply pipe (not shown) is provided independently of the nitrogen-containing gas supply pipe 232b. An inert gas source, a mass flow controller and a valve are provided on the inert gas supply pipe.

A valve 254 is provided at the downstream side of the junction of the hydrogen-containing gas supply pipe 232a and the nitrogen-containing gas supply pipe 232b. The valve 254 is connected to the gas inlet 234 through a gasket 203b. By opening the valves 253a, 253b and 254, the hydrogen-containing gas and the nitrogen-containing gas can be supplied into the processing chamber 201 via the gas supply pipes 232a and 232b while adjusting the flow rates of the respective gases with the mass flow controllers 252a and 252b.

A gas supply unit according to the present embodiment is mainly made up of the shower head 236 (the lid 233, the gas inlet 234, the buffer room 237, the opening 238, the shield plate 240 and the gas outlet 239), the gas supply pipes 232, the mass flow controllers 252a and 252b and the valves 253a, 253b and 254. Moreover, the hydrogen-containing gas supply pipe 232a, the nitrogen-containing gas supply pipe 232b, the $H_2$ gas source 250a and the $N_2$ gas source 250b may be included in the gas supply unit.

<Gas Exhaust Unit>

A gas exhaust port 235 for discharging the gases from the inside of the processing chamber 201 is provided in the sidewall of the lower vessel 211. The upstream end of a gas exhaust pipe 231a is connected to the gas exhaust port 235. A diaphragm gauge (not shown) as a pressure control sensor, e.g., a capacitance manometer, is provided in the gas exhaust port 235. The diaphragm gauge is configured to measure an upper limit pressure of up to, e.g., 2 Torr (266 Pa). An APC (Auto Pressure Controller) 242 as a pressure regulator (pressure regulating unit), a turbo molecular pump 246a as an evacuating device, a main valve 243a as an on-off valve and a dry pump 246b as an evacuating device are provided on the gas exhaust pipe 231a in the named order from the upstream side.

The APC 242 is an on-off valve capable of performing and stopping evacuation by opening and closing a valve and capable of adjusting the opening degree of a valve based on the pressure information measured by the diaphragm gauge, thereby adjusting the internal pressure of the processing chamber 201. The substrate processing using the MMT apparatus 100 is performed at a pressure of, e.g., 240 Pa or less. If the upper limit pressure of the diaphragm gauge is set to, e.g., 2 Torr (266 Pa), it is possible to enhance the measurement accuracy in the substrate processing pressure region and to obtain high pressure controllability and high resolving power during the substrate processing.

The turbo molecular pump 246a may be of, e.g., a broadband type. In this case, the turbo molecular pump 246a can work even if the maximum pressure at the upstream side of the turbo molecular pump 246a, namely at the primary side of the turbo molecular pump 246a, is as high as 400 Pa.

A gas exhaust pipe 231b making up a slow exhaust line is provided at the downstream side of the turbo molecular pump 246a, namely at the secondary side of the turbo molecular pump 246a. More specifically, the upstream end of the gas exhaust pipe 231b is connected to the gas exhaust pipe 231a between the turbo molecular pump 246a and the main valve 243a. The downstream end of the gas exhaust pipe 231b is connected to the gas exhaust pipe 231a between the main valve 243a and the dry pump 246b. For instance, a ⅜ inch pipe is used as the gas exhaust pipe 231b and a slow exhaust valve 243b as an on-off valve is provided on the gas exhaust pipe 231b.

A gas exhaust unit according to the present embodiment is mainly made up of the gas exhaust port 235, the diaphragm gauge, the gas exhaust pipe 231a and the APC 242. Moreover, the turbo molecular pump 246a, the main valve 243a, the dry pump 246b, the gas exhaust pipe 231b and the slow exhaust valve 243b may be included in the gas exhaust unit.

<Exciting Unit>

Next, description will be made on a plasma generating unit as an exciting unit. A tubular electrode 215 as a first electrode is provided in the outer circumferential portion of the processing chamber 201, namely on the outer surface of the sidewall of the upper vessel 210, so as to surround the processing chamber 201. The tubular electrode 215 is formed into a tubular shape, e.g., a cylindrical shape. The tubular electrode 215 is connected to a high-frequency power source 273 having a frequency of, e.g., 13.56 MHz, for applying high-frequency power via an impedance matching box 272 that performs impedance matching.

An upper magnet 216a and a lower magnet 216b are respectively attached to the upper and lower end portions of the outer surface of the tubular electrode 215. Each of the upper magnet 216a and the lower magnet 216b is formed of a permanent magnet having a tubular shape, e.g., a cylindrical shape. The upper magnet 216a and the lower magnet 216b have magnetic poles on the surfaces thereof facing the processing chamber 201 and on the opposite surfaces thereof. The upper magnet 216a and the lower magnet 216b are arranged such that the magnetic poles thereof are opposite each other. In other words, the magnetic poles of the surfaces of the upper magnet 216a and the lower magnet 216b facing toward the processing chamber 201 differ from each other. Thus, magnetic flux lines extending in an axial direction are formed along the inner surface of the tubular electrode 215.

If magnetic fields are generated by the upper magnet 216a and the lower magnet 216b and if electric fields are formed by supplying high-frequency power to the tubular electrode 215 after introducing different kinds of gases into the processing chamber 201, magnetron discharge plasma is generated in the plasma generation region 224 within the processing chamber 201 as shown in FIG. 2. Since the emitted electrons are caused to make orbital movement by the electric fields and the magnetic fields, the ionization rate of plasma becomes higher. This makes it possible to generate long-life and high-density plasma.

A metal-made shield plate 223 for effectively shielding the electric fields and the magnetic fields is provided around the tubular electrode 215, the upper magnet 216a and the lower magnet 216b so that the electric fields and the magnetic fields formed by the tubular electrode 215, the upper magnet 216a and the lower magnet 216b should not adversely affect other devices and the external environment. A plasma generating unit as an exciting unit according to the present embodiment is mainly made up of the tubular electrode 215, the impedance matching box 272, the high-frequency power source 273, the upper magnet 216a and the lower magnet 216b.

<Control Unit>

Figure 7:
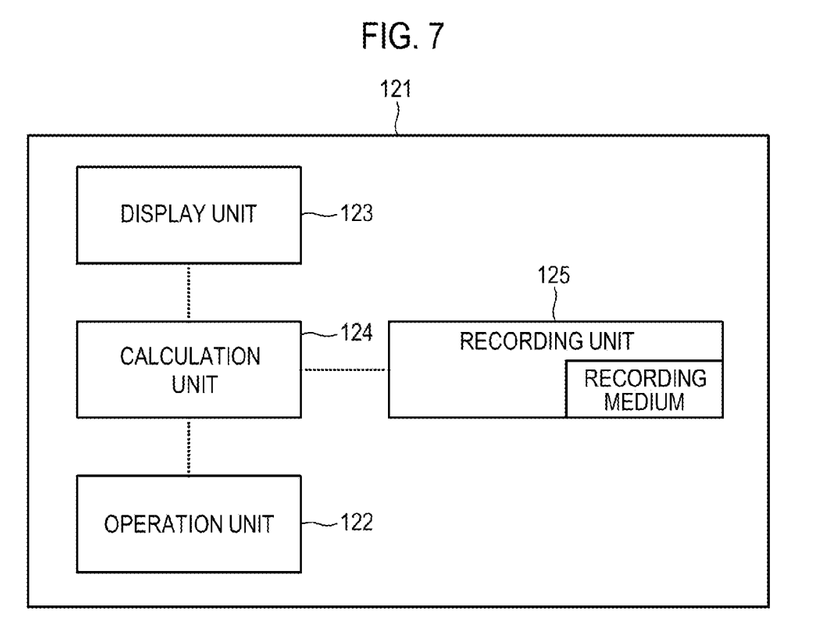
FIG. 7 is a view showing a configuration example of a controller according the first embodiment of the present disclosure.

A controller 121 as a control unit serves to control the respective units, such as the gas supply unit, the gas exhaust unit and the exciting unit, which make up the substrate processing apparatus. The controller 121 is configured to control the diaphragm gauge, the APC 242, the turbo molecular pump 246a, the dry pump 246b, the main valve 243a and the slow exhaust valve 243b via a signal line A, to control the susceptor elevator mechanism 268 via a signal line B, to control the heater 217c and the impedance variable mechanism 274 via a signal line C, to control the gate valve 244 via a signal line D, to control the impedance matching box 272 and the high-frequency power source 273 via a signal line E, to control the mass flow controllers 252a and 252b and the valves 253a, 253b and 254 via a signal line F, and to control the lamp heater unit 280 via a signal line G. As shown in FIG. 7, the controller 121 includes an operation unit 122 for receiving different instructions and data input by an operator, a display unit 123 for displaying different data and the like, a calculation unit 124 for calculating the inputted data, and a recording unit 125 having a recording medium for recording programs (recipes) needed to control the respective units and to perform the substrate processing process to be described later.

<Substrate Transfer Chamber>

A substrate transfer chamber (not shown) connected to the processing chamber 201 through the gate valve 244 is provided in the MMT apparatus 100. A transfer mechanism is provided in the substrate transfer chamber. The transfer mechanism is configured to load a substrate into the processing furnace 202 and to unload the substrate from the processing furnace 202. The temperature within the substrate transfer chamber is kept at room temperature. The pressure within the substrate transfer chamber is kept at 0.1 Pa or more and 266 Pa or less, e.g., at about 100 Pa. The substrate transfer chamber is configured to ensure that, even if particles are generated within the substrate transfer chamber, the particles do not fly despite the operation of the transfer mechanism.

(2) Substrate Processing Process

Next, description will be made on a substrate processing process performed by the substrate processing apparatus according to the first embodiment. The substrate processing process according to the present embodiment includes a pre-processing process (dummy substrate processing process) for processing a dummy substrate and a main processing process (product substrate processing process) for processing a product substrate. The substrate processing process is, e.g., one of processes for manufacturing a semiconductor device and is performed by the aforementioned MMT apparatus 100. In the main processing process, just like the nitriding of, e.g., a gate oxide film, a nitriding process as a reforming process is performed with respect to the oxide film formed on the surface of the wafer 200 made of silicon (Si). In the following description, the operations of the respective units making up the MMT apparatus 100 are controlled by the controller 121.

(2-1) Product Substrate Processing Process

First, description will be made on the product substrate processing process (the main processing process). The main processing process includes a substrate loading step A, a substrate heating step B, a substrate transfer step C, a process gas supply step D, a plasma processing step E, an evacuation step F and a substrate unloading step G.

<A. Substrate Loading Step>

First, the inside of the product substrate is kept at the same pressure as the pressure within the substrate transfer chamber, e.g., at 100 Pa. Thereafter, the wafer 200 having an oxide film formed on the surface thereof is loaded from the substrate transfer chamber into the processing chamber 201. More specifically, the inside of the processing chamber 201 is evacuated by the turbo molecular pump 246a and the dry pump 246b. A gas remaining inert against the wafer 200 and the processing performed with respect to the wafer 200, e.g., a $N_2$ gas, is supplied into the processing chamber 201. Then, the pressure within the processing chamber 201 is adjusted. Next, the susceptor 217 is lowered to the transfer position of the wafer 200, causing the wafer pushup pins 266 to extend through the through-holes 217a of the susceptor 217. As a result, the wafer pushup pins 266 protrude beyond the upper surface of the susceptor 217 by a specified height, e.g., about 0.5 to 3.0 mm. Subsequently, the gate valve 244 is opened and the wafer 200 is loaded from the substrate transfer chamber (not shown) adjoining the processing chamber 201 into the processing chamber 201 through the use of a transfer mechanism not shown in the drawings. As a consequence, the wafer 200 is horizontally supported on the wafer pushup pins 266 protruding from the upper surface of the susceptor 217. After the wafer 200 is loaded into the processing chamber 201, the transfer mechanism is moved out of the processing chamber 201 and the gate valve 244 is closed, thereby hermetically sealing the processing chamber.

The heater 217c is supplied with electric power in advance, the heater 217c and the susceptor 217 are heated to a specified temperature within a range of, e.g., 25 degrees C. or more and 700 degrees C. or less. At this time, if the loaded wafer 200 is directly transferred onto the susceptor 217, the surface of the wafer 200 making contact with the susceptor 217 is heated with ease. For that reason, a difference in the heating speed may be generated between the surface of the wafer 200 making contact with the susceptor 217 and the opposite surface of the wafer 200. As a result, there is likelihood that the wafer 200 may be warped due to the difference in thermal expansion between the opposite surfaces of the wafer 200. The wafer 200 may easily warp at a temperature of, e.g., 700 degrees C. or more. In the present embodiment, warping of the wafer 200 is minimized by performing the following substrate heating step before the wafer 200 is transferred onto the susceptor 217.

<B. Substrate Heating Step>

In the substrate heating step, the wafer 200 loaded into the processing chamber 201 is heated. More specifically, the wafer 200 is positioned above the susceptor 217 heated to a specified temperature within a range of, e.g., 25 degrees C. or more and 900 degrees C. or less and is supported by the wafer pushup pins 266 in a spaced-apart relationship with the susceptor 217. The Inside of the processing chamber 201 is evacuated by the turbo molecular pump 246a and the dry pump 246b through the exhaust pipe 231a, whereby the pressure within the processing chamber 201 is set equal to a specified value within a range of, e.g., 0.1 Pa or more and 266 Pa or less. The turbo molecular pump 246a and the dry pump 246b are operated at least until the substrate unloading step G (to be described later) comes to an end.

If the aforementioned state is maintained for a specified time, e.g., 40 to 60 seconds, the wafer 200 is gradually heated to a specified temperature by the radiant heat of the susceptor 217, at which time the surface of the wafer 200 facing the susceptor 217 is first heated. Since the wafer 200 is supported is a spaced-apart relationship with the susceptor 217, the surface of the wafer 200 facing the susceptor 217 is restrained from being rapidly heated. Thus, it is possible to reduce a difference in the heating speed between the surface of the wafer 200 facing the susceptor 217 (hereinafter referred to as lower surface) and the opposite surface of the wafer 200 (hereinafter referred to as upper surface). This makes it possible to restrain the wafer 200 from warping.

In some embodiments, the distance between the wafer 200 and the susceptor 217 may be adjusted depending on the difference between the temperature of the wafer 200 at the loading time (e.g., the room temperature) and the temperature of the susceptor 217 heated to a specified temperature. In other words, if the difference between the temperature of the wafer 200 and the temperature of the susceptor 217 is large, the distance between the wafer 200 and the susceptor 217 is set to be longer. This makes it possible to restrain the lower surface of the wafer 200 from being rapidly heated and to restrain generation of a difference in the heating speed between the lower surface and the upper surface of the wafer 200. If the difference between the temperature of the wafer 200 and the temperature of the susceptor 217 is small, the distance between the wafer 200 and the susceptor 217 is set to be shorter. This makes it possible to accelerate the heating of the wafer 200 and to shorten the time required for the wafer 200 to reach a specified temperature. The distance between the wafer 200 and the susceptor 217 can be adjusted by, e.g., lifting or lowering the susceptor 217 with the susceptor elevator mechanism 268.

<C. Substrate Transfer Step>

After the lapse of a specified time, the wafer 200 heated to the specified temperature is transferred from the wafer pushup pins 266 onto the susceptor 217. In other words, the susceptor 217 is lifted by the susceptor elevator mechanism 268 to have the wafer 200 supported on the susceptor 217. Thereafter, the wafer 200 is moved up to a specified processing position.

<D. Process gas Supply Step>

Next, a nitrogen-containing gas (an $N_2$ gas in the present embodiment) as a reforming gas for nitriding the oxide film formed on the wafer 200 and a hydrogen gas are supplied into the processing chamber 201. As stated above, the hydrogen gas is used to adjust the nitrogen concentration within the processing chamber 201 and to enhance the nitriding efficiency of the oxide film formed on the surface of the wafer 200. More specifically, the valves 253a, 253b and 254 are opened and the $H_2$ gas and the $N_2$ gas are supplied into the processing chamber 201 through the buffer room 237 while controlling the flow rates of the $H_2$ gas and the $N_2$ gas with the mass flow controllers 252a and 252b. At this time, the flow rates of the $H_2$ gas and the $N_2$ gas are set to be equal to specified values within a range of, e.g., 50 sccm or more and 2000 sccm or less. The inside of the processing chamber 201 is evacuated while adjusting the opening degree of the APC 242 such that the pressure within the processing chamber 201 becomes equal to a specified pressure within a range of, e.g., 1 Pa or more and 266 Pa or less. While appropriately evacuating the inside of the processing chamber 201 in this manner, the $H_2$ gas and the $N_2$ gas are continuously supplied until the plasma processing step E (to be described later) is finished.

<E. Plasma Processing Step>

After the pressure within the processing chamber 201 is stabilized, high-frequency electric power having a specified output value within a range of, e.g., 150 W or more and 1000 W or less is applied from the high-frequency power source 273 to the tubular electrode 215 via the impedance matching box 272. At this time, the impedance variable mechanism 274 is controlled, in advance, to have a specified impedance value, thereby controlling the electric potential difference between the susceptor 217 and the tubular electrode 215, i.e., the bias voltage of the susceptor 217, to become a specified value. Thus, plasma discharge is generated within the processing chamber 201, namely within the plasma generation region 224 existing above the wafer 200, thereby exciting the $N_2$ gas and the $H_2$ gas. The $N_2$ gas and the $H_2$ gas are turned to, e.g., plasma, and are dissociated to thereby generate reactive species such as nitrogen active species containing nitrogen (N). By the nitrogen active species generated as a result of excitation of the $N_2$ gas, the surface of the wafer 200 is subjected to nitriding as a reforming process.

Then, the application of electric power from the high-frequency power source 273 is stopped after the lapse of a specified processing time, e.g., 45 seconds, thereby stopping the plasma discharge within the processing chamber 201. The valves 253a, 253b and 254 are closed to thereby stop the supply of the $H_2$ gas and the $N_2$ gas into the processing chamber 201. Thus, the plasma processing step E is finished.

<F. Evacuation Step>

After the supply of the $H_2$ gas and the $N_2$ gas is stopped, the inside of the processing chamber 201 is evacuated through the use of the gas exhaust pipe 231a, whereby the $H_2$ gas and the $N_2$ gas existing within the processing chamber 201 and the gas generated by the reaction of the $N_2$ gas are discharged out of the processing chamber 201. Thereafter, the opening degree of the APC 242 is adjusted to make the pressure within the processing chamber 201 equal to the pressure (e.g., 100 Pa) within the substrate transfer chamber (the unloading destination of the wafer 200, not shown) adjoining the processing chamber 201.

<G Substrate Unloading Step>

After the pressure within the processing chamber 201 is adjusted to a specified pressure, the susceptor 217 is lowered to the transfer position of the wafer 200 to have the wafer 200 supported on the wafer pushup pins 266. Then, the gate valve 244 is opened and the wafer 200 is unloaded out of the processing chamber 201 through the use of the transfer mechanism not shown in the drawings. In the manner described above, the main processing process is finished.

(2-2) Dummy Substrate Processing Process

Next, description will be made on the dummy wafer processing process (the preprocessing process) according to the present embodiment. The preprocessing process is performed prior to the main processing process in order to ensure that the gas concentration and the temperature within the processing chamber are stabilized in the main processing process, particularly when starting the processing of the product wafer and further that the quality of the processed product wafer, e.g., the nitrogen concentration in the oxide film, falls within a specified standard and does not greatly vary depending on the product wafers. For example, the preprocessing process is performed when the atmosphere within the processing chamber has an oxygen concentration differing from a specified value, e.g., after an idle state in which the product wafer is not processed is maintained for a long time or after the inside of the processing chamber is exposed to the atmosphere for maintenance purposes. In the preprocessing process, the dummy wafer having an oxide film formed on the surface thereof is subjected to nitriding more strongly than in the main processing process (with a stronger nitriding power). The oxygen ejected from the oxide film is caused to adhere to the inner wall of the processing chamber, the shower head and the like in a larger amount than in the main processing process. The amount of the adhering oxygen is finely adjusted in a rapid manner.

The stronger nitriding in the preprocessing process can be realized by using the following methods (a) through (d), either independently or in combination.

(a) The pressure within the processing chamber is set lower than the pressure used in the main processing process. In this case, the mean free path of a gas becomes longer and the oxygen ejected from the oxide film formed on the wafer surface reaches the surface of the inner wall of the processing chamber with ease.

(b) The bias voltage of the susceptor is set higher than the bias voltage used in the main processing process. In this case, it becomes possible to increase the amount of plasma brought into the wafer and to increase the amount of oxygen ejected from the oxide film formed on the wafer surface. The plasma as a whole is drawn closer to the wafer than the inner wall of the processing chamber. For that reason, the wafer is exposed to the plasma more heavily than the inner wall of the processing chamber. Accordingly, the oxygen atoms ejected from the wafer adhere to the inner wall of the processing chamber with ease and the amount of the oxygen atoms adhering to the inner wall of the processing chamber can be finely adjusted in a rapid manner. If the bias voltage of the susceptor is not set higher than the bias voltage used in the main processing process, the inner wall of the processing chamber is also exposed to a large amount of plasma. For that reason, it is difficult for the oxygen atoms to adhere to the inner wall of the processing chamber.

(c) The high-frequency electric power applied to the tubular electrode is set higher than the electric power used in the main processing process. In this case, the amount of oxygen ejected from the oxide film formed on the wafer surface can be made larger than the amount of oxygen ejected in the main processing process.

(d) The plasma processing time is set longer than the plasma processing time used in the main processing process. In this case, the amount of oxygen ejected from the oxide film formed on the wafer surface can be made larger than the amount of oxygen ejected in the main processing process.

The dummy wafer processing process (the preprocessing process) includes a substrate loading step DA, a substrate heating step DB, a substrate transfer step DC, a process gas supply step DD, a plasma processing step DE, an evacuation step DF and a substrate unloading step DG The substrate loading step DA, the substrate heating step DB, the substrate transfer step DC, the evacuation step DF and the substrate unloading step DG remain the same as the substrate loading step A, the substrate heating step B, the substrate transfer step C, the evacuation step F and the substrate unloading step G of the main processing process for the product wafer, except that a dummy wafer is used in place of the product wafer. Therefore, no description will be made on the substrate loading step DA, the substrate heating step DB, the substrate transfer step DC, the evacuation step DF and the substrate unloading step DG. The process gas supply step DD and plasma processing step DE will be described now.

<DD. Process Gas Supply Step>

The substrate loading step DA, the substrate heating step DB and the substrate transfer step DC are performed in a similar manner as in the substrate loading step A, the substrate heating step B and the substrate transfer step C for the product wafer. Thereafter, in the process gas supply step DD, a hydrogen gas and a nitrogen-containing gas as a reforming gas (the mixed gas of a $H_2$ gas and a $N_2$ gas in the present embodiment) are supplied into the processing chamber 201.

The supply method of the $H_2$ gas and the $N_2$ gas is the same as the method used in the process gas supply step D for the product wafer, except the gas flow rates and the pressure within the processing chamber 201. In the process gas supply step DD, the flow rates of the $H_2$ gas and the $N_2$ gas are set equal to specified values within a range of, e.g., 50 sccm or more and 2000 sccm or less. The inside of the processing chamber 201 is evacuated while adjusting the opening degree of the APC 242 such that the pressure within the processing chamber 201 is kept at a specified pressure lower than the pressure used in the process gas supply step D for the product wafer, within a range of, e.g., 1 Pa or more and 266 Pa or less. While appropriately evacuating the inside of the processing chamber 201 in this manner, the $H_2$ gas and the $N_2$ gas are continuously supplied until the plasma processing step DE (to be described later) is finished.

<DE Plasma Processing Step>

The plasma processing step DE of the present embodiment is similar to the plasma processing step E for the product wafer, except the pressure within the processing chamber 201, the electric potential of the susceptor 217 and the processing time. In the plasma processing step DE, just like the process gas supply step E for the product wafer, after the pressure within the processing chamber 201 is stabilized, the high-frequency electric power having a specified output value within a range of, e.g., 150 W or more and 1000 W or less is applied from the high-frequency power source 273 to the tubular electrode 215 via the impedance matching box 272. At this time, the impedance variable mechanism 274 is controlled, in advance, to have a specified impedance value as will be described later. Thus, plasma discharge is generated within the processing chamber 201, namely within the plasma generation region 224 existing above the dummy wafer, thereby exciting the $N_2$ gas and the $H_2$ gas. The $N_2$ gas and the $H_2$ gas are turned to, e.g., plasma, and are dissociated to thereby generate reactive species such as nitrogen active species containing nitrogen (N). By the nitrogen active species, the surface of the dummy wafer and the surface of the inner wall of the processing chamber 201 are subjected to nitriding.

At this time, the impedance variable mechanism 274 is controlled in the following manner to have a specified impedance value. In other words, the value of the variable capacitor of the impedance variable mechanism 274 is changed to control the electric potential (the bias voltage) of the susceptor 217 to become a specified value lower than the electric potential of the susceptor 217 (higher than the bias voltage of the susceptor 217) used in the plasma processing step E for the product wafer. The value of the variable capacitor is controlled to range from 0 to 100 in such a manner that the electric potential of a wafer becomes higher as the value of the variable capacitor decreases while the electric potential of the wafer becomes lower as the value of the variable capacitor increases. Thus, the electric potential of the dummy wafer becomes lower than the electric potential of the product wafer available in the plasma processing step E for the product wafer. Therefore, as described above, it becomes possible to increase the amount of plasma brought into the dummy wafer and to increase the amount of oxygen ejected from the oxide film formed on the dummy wafer surface. The plasma as a whole is drawn closer to the dummy wafer than the inner wall of the processing chamber. For that reason, the oxygen atoms ejected from the dummy wafer adhere to the inner wall of the processing chamber with ease.

Then, the application of electric power from the high-frequency power source 273 is stopped after the lapse of a specified processing time, e.g., 120 seconds, thereby stopping the plasma discharge within the processing chamber 201. The valves 253a, 253b and 254 are closed to thereby stop the supply of the $H_2$ gas and the $N_2$ gas into the processing chamber 201. Thus, the plasma processing step DE is finished. Thereafter, just like the evacuation step F and the substrate unloading step G for the product wafer, the evacuation step DF and the substrate unloading step DG are performed.

As described above, in the plasma processing step DE, the processing is performed with increased nitriding power by keeping the pressure within the processing chamber 201 lower than the pressure used in the plasma processing step E for the product wafer and by keeping the electric potential of the susceptor 217 lower than the electric potential used in the plasma processing step E for the product wafer (keeping the bias voltage of the susceptor 217 higher than the bias voltage used in the plasma processing step E for the product wafer), namely by keeping the electric potential of the dummy wafer lower than the electric potential used in the plasma processing step E for the product wafer. Accordingly, it is possible to reduce the number of dummy wafers used. Moreover, it becomes easy to finely adjust, at a ppm order or a ppb order, the oxygen amount within the processing chamber 201 in the plasma processing step E for the product wafer. According to the tests conducted by the inventors of the subject application, if the process conditions (e.g., the pressure within the processing chamber 201 and the electric potential of the susceptor 217) in the plasma processing step DE for the dummy wafer are set equal to the process conditions in the plasma processing step E for the product wafer, it is not easy to finely adjust, at a ppm order or a ppb order, the oxygen amount within the processing chamber 201 in the plasma processing step E for the product wafer. Under these circumstances, the inventors of the subject application have conceived the method in which, as described above, in the plasma processing step DE, the processing is performed with a nitriding power higher than the nitriding power used in the plasma processing step E for the product wafer.

(3) Working Example

Figure 5:
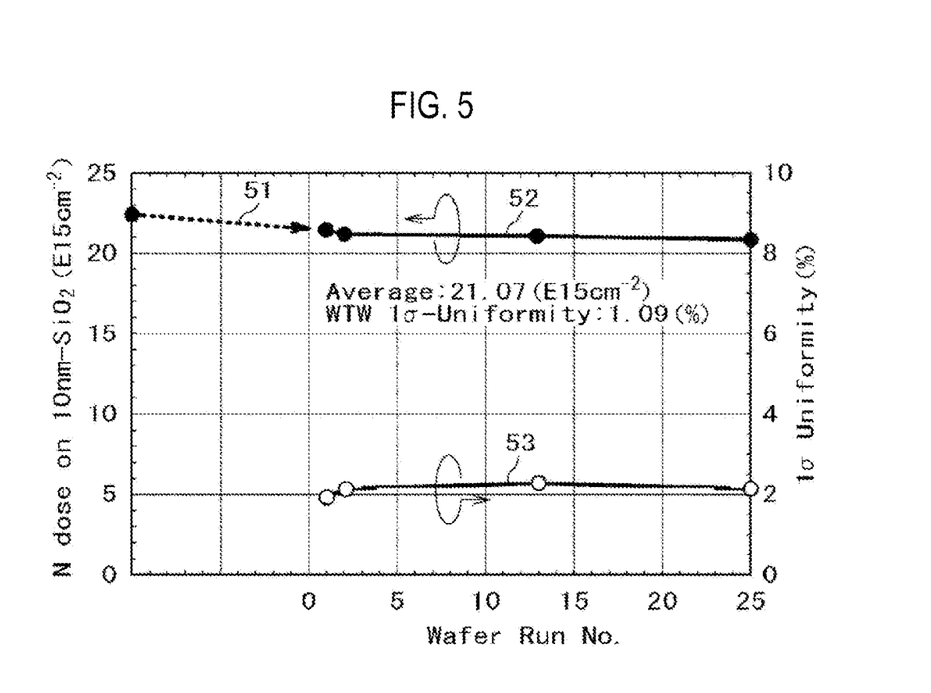
FIG. 5 is a view showing the content of nitrogen injected into an oxide film and the inter-substrate nitrogen content uniformity when the wafers each having an oxide film formed on the surface thereof are continuously subjected to nitriding according to the first embodiment of the present disclosure.

Next, description will be made on a working example in which the substrate processing process including the preprocessing process and the main processing process according to the first embodiment is performed. FIG. 5 is a view showing the content of nitrogen injected into an oxide film and the inter-substrate nitrogen content uniformity when the wafers each having an oxide film formed on the surface thereof are continuously subjected to nitriding according to the first embodiment of the present disclosure. In FIG. 5, the left vertical axis indicates a nitrogen dose amount, i.e., the number of nitrogen atoms injected into the oxide film ($1 \times 10^5$/cm$^2$). The right vertical axis indicates an inter-wafer standard deviation ($1\sigma$) of the nitrogen dose amount. The horizontal axis indicates the run numbers of the product wafers processed. The run numbers are given in a processing order. Reference symbol 51 designates the nitrogen dose amount when, after keeping the inside of the processing chamber 201 in an oxygen-free atmospheric state, namely in a state in which the influence of oxygen is negligible, the dummy processing process (the preprocessing process) is performed for 120 seconds with respect to eight silicon wafers each having a 10 nm-thick oxide film (SiO$_2$ film) formed on the surface thereof, by setting the wafer temperature equal to 650 degrees C., the flow rates of the H$_2$ gas and the N$_2$ gas equal to 500 sccm, the pressure within the processing chamber 201 equal to 30 Pa, the high-frequency electric power applied to the tubular electrode 215 equal to 800 W, and the bias voltage of the susceptor 217 equal to a specified value lower than the bias voltage used in the main processing process (at which time the position of the variable capacitor of the impedance variable mechanism 274 is at 40), namely the electric potential of the wafers is equal to a specified value lower than the electric potential used in the main processing process.

Reference symbol 52 designates the nitrogen dose amount when, subsequent to the dummy processing process, the main processing process is performed for 45 seconds with respect to silicon wafers each having a 10 nm-thick oxide film (SiO$_2$ film) formed on the surface thereof, by setting the wafer temperature equal to 650 degrees C., the flow rates of the H$_2$ gas and the N$_2$ gas equal to 1000 sccm, the pressure within the processing chamber 201 equal to 100 Pa which is higher than the pressure used in the preprocessing process, the high-frequency electric power applied to the tubular electrode 215 equal to 800 W, and the bias voltage of the susceptor 217 equal to a specified value lower than the bias voltage used in the preprocessing process (at which time the position of the variable capacitor of the impedance variable mechanism 274 is at 16), namely the electric potential of the wafers equal to a specified value higher than the electric potential used in the preprocessing process. Reference symbol 53 designates an inter-wafer standard deviation ($1\sigma$) of the nitrogen dose amount when the main processing process is performed.

As described above, in the example shown in FIG. 5, the dummy processing process (the preprocessing process) is performed with respect to the silicon wafers each having a 10 nm-thick oxide film (SiO$_2$ film) formed on the surface thereof, after keeping the inside of the processing chamber 201 in an oxygen-free atmospheric state. Thereafter, the product wafers are processed (subjected to the main processing process). It was confirmed that, even if the number of the dummy wafers is five or so, the dummy processing can provide the equivalent effects. As shown in FIG. 5, the standard deviation ($1\sigma$) of the nitrogen dose amount in one to twenty five product wafers is 1.09%. A good result can be obtained by subjecting about five to eight wafers to the dummy processing (the preprocessing) according to the first embodiment. It is therefore possible to significantly reduce the necessary number of dummy processing as compared with the related art. As set forth above, the process conditions used in the preprocessing process are set such that the wafer temperature becomes equal to 650 degrees C., the flow rates of the H$_2$ gas and the N$_2$ gas becomes equal to 500 sccm, the pressure within the processing chamber 201 becomes equal to 30 Pa, the high-frequency electric power applied to the tubular electrode 215 becomes equal to 800 W, the position of the variable capacitor of the impedance variable mechanism 274 is at 40 and the processing time is 120 seconds. The wafer temperature is the same as the wafer temperature of the main processing, the flow rates of the H$_2$ gas and the N$_2$ gas are 0.5 times as high as the flow rates of the main processing, the pressure within the processing chamber 201 is 0.3 times as high as the pressure of the main processing, the high-frequency electric power is the same as the high-frequency electric power of the main processing, the position of the variable capacitor is 2.5 times as high as the position of the variable capacitor of the main processing, and the processing time is 2.7 times as long as the processing time of the main processing. Since the magnification is simple, an operator can easily set the process conditions in the preprocessing process. The process conditions in the preprocessing process can be input from the operation unit.

According to the first embodiment, it is possible in some instances to provide at least the following effects (1) to (3).

(1) In the dummy wafer processing process (the preprocessing process) performed prior to the product wafer processing process (the main processing process), the nitriding is performed under a condition that the nitriding power is higher than nitriding power used in the product wafer processing process. For that reason, the oxygen concentration within the processing chamber during the plasma processing of the preprocessing process can be made equal to a specified constant concentration more rapidly than in the related art. It is therefore possible to reduce the number of dummy wafers as compared with the related art. This makes it possible to shorten the processing time of the whole substrate processing process including the preprocessing process and the main processing process.

(2) The dummy wafer processing process (the preprocessing process) and the product wafer processing process (the main processing process) are performed through the use of a N$_2$ gas and a H$_2$ gas. Therefore, in the main processing process, it is possible to efficiently nitride the oxide film formed on the wafer surface. In the preprocessing process, it is easy to have the oxygen concentration within the processing chamber come closer to the oxygen concentration of the main processing process.

(3) The dummy wafer processing process (the preprocessing process) is performed through the use of a N$_2$ gas and a H$_2$ gas. Therefore, as compared with a case where the dummy wafer processing process is performed through the use of, e.g., a N$_2$ gas and an O$_2$ gas, it becomes easy to finely adjust, at a ppm order or a ppb order, the oxygen amount within the processing chamber during the plasma processing of the preprocessing process.

In the aforementioned embodiment, an N$_2$ gas is used as the nitrogen-containing gas serving as a process gas. It is however possible to use other gases having a nitriding action, e.g., an ammonia gas (NH$_3$ gas). In place of the H$_2$ gas, it is possible to use an Ar gas or other gases. In the aforementioned embodiment, the bias voltage of the susceptor 217 is controlled to become a specified value by adjusting the impedance adjusting electrode 217b of the susceptor 217 with the impedance variable mechanism 274. However, the bias voltage of the susceptor 217 may be controlled to become a specified value without having to install an impedance adjusting electrode in the susceptor 217. For example, a bias voltage may be applied to the processing vessel 203 as a whole.

In the aforementioned embodiment, the wafer 200 is heated by the heater 217c installed within the susceptor 217. However, the present disclosure is not limited thereto. For example, the wafer 200 may be heated by irradiating infrared rays or the like with the lamp heater unit 280 as well as the heater 217c. If the heater 217c and the lamp heater unit 280 are used in combination, it is possible to heat the wafer 200 more rapidly than when only the heater 217c is used. Without having to install the heater 217c, the wafer 200 may be heated through the use of only the lamp heater unit 280. The lamp heater unit 280 is controlled by the controller 121 via a signal line G. In the aforementioned embodiment, the preprocessing is performed with the dummy wafer and then the main processing is performed with the product wafer. However, the preprocessing may be performed with the product wafer.

In the aforementioned embodiment, the atmosphere within the processing chamber 201 is adjusted by performing the substrate heating step DB of the preprocessing process in the same manner as in the substrate heating step B of the main processing process. By omitting the step of heating the wafer 200 supported by the wafer pushup pins 266 in a spaced-apart relationship with the susceptor 217, it is possible to shorten the substrate heating step DB.

In the aforementioned embodiment, the present disclosure is embodied through the use of the substrate processing apparatus formed of the MMT apparatus 100. However, the present disclosure is not limited thereto but may be embodied through the use of other apparatuses, e.g., an ICP (Inductively Coupled Plasma) apparatus or an ECR (Electron Cyclotron Resonance) apparatus.

Second Embodiment

Figure 3:
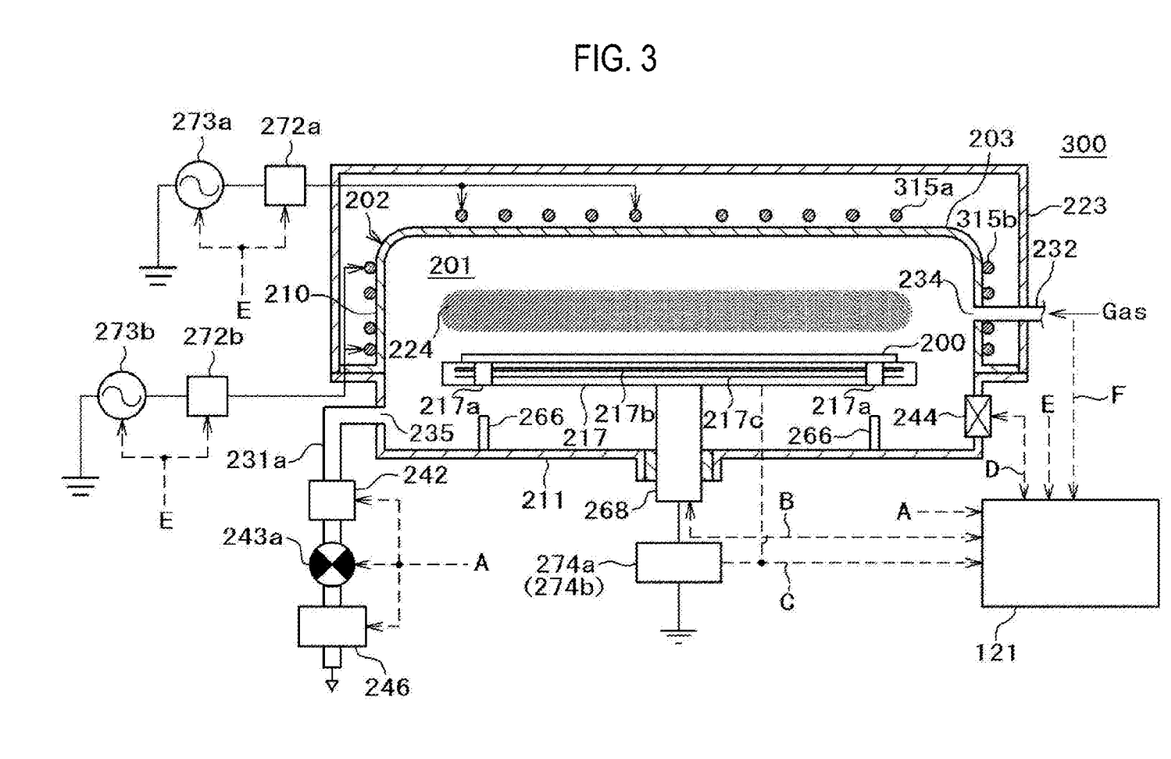
FIG. 3 is a vertical section view of an ICP plasma processing apparatus according to a second embodiment of the present disclosure.

Next, a second embodiment will be described with reference to FIG. 3. FIG. 3 shows an ICP plasma processing apparatus 300 serving as a substrate processing apparatus according to a second embodiment of the present disclosure. The components having the same functions as those of the first embodiment will be designated with like reference symbols with no detailed description made on the configurations of the second embodiment. The gas supply unit is not shown in FIG. 3. The ICP plasma processing apparatus 300 according to the second embodiment generates plasma by supplying electric power via the impedance matching boxes 272a and 272b, the high-frequency power sources 273a and 273b and the induction coils 315a and 315b. The induction coil 315a is installed on the ceiling-side outer surface of the processing vessel 203. The induction coil 315b is installed on the outer surface of the outer circumferential wall of the processing vessel 203.

In the preprocessing and the main processing according to the second embodiment, a process gas containing hydrogen atoms and nitrogen atoms is supplied from the gas supply pipe 232 into the processing chamber 201 via the gas inlet 234. If high-frequency electric power flows through the induction coils 315a and 315b as an exciting unit before and after the gas supply, electric fields are generated by electric field induction. Using the electric fields as energy, the process gas is excited in a plasma state. This makes it possible to generate active species. In the second embodiment, the dummy wafer processing of the present disclosure as preprocessing is performed before performing, in the main processing, the nitriding of the oxide film formed on the product wafer.

Third Embodiment

Figure 4:
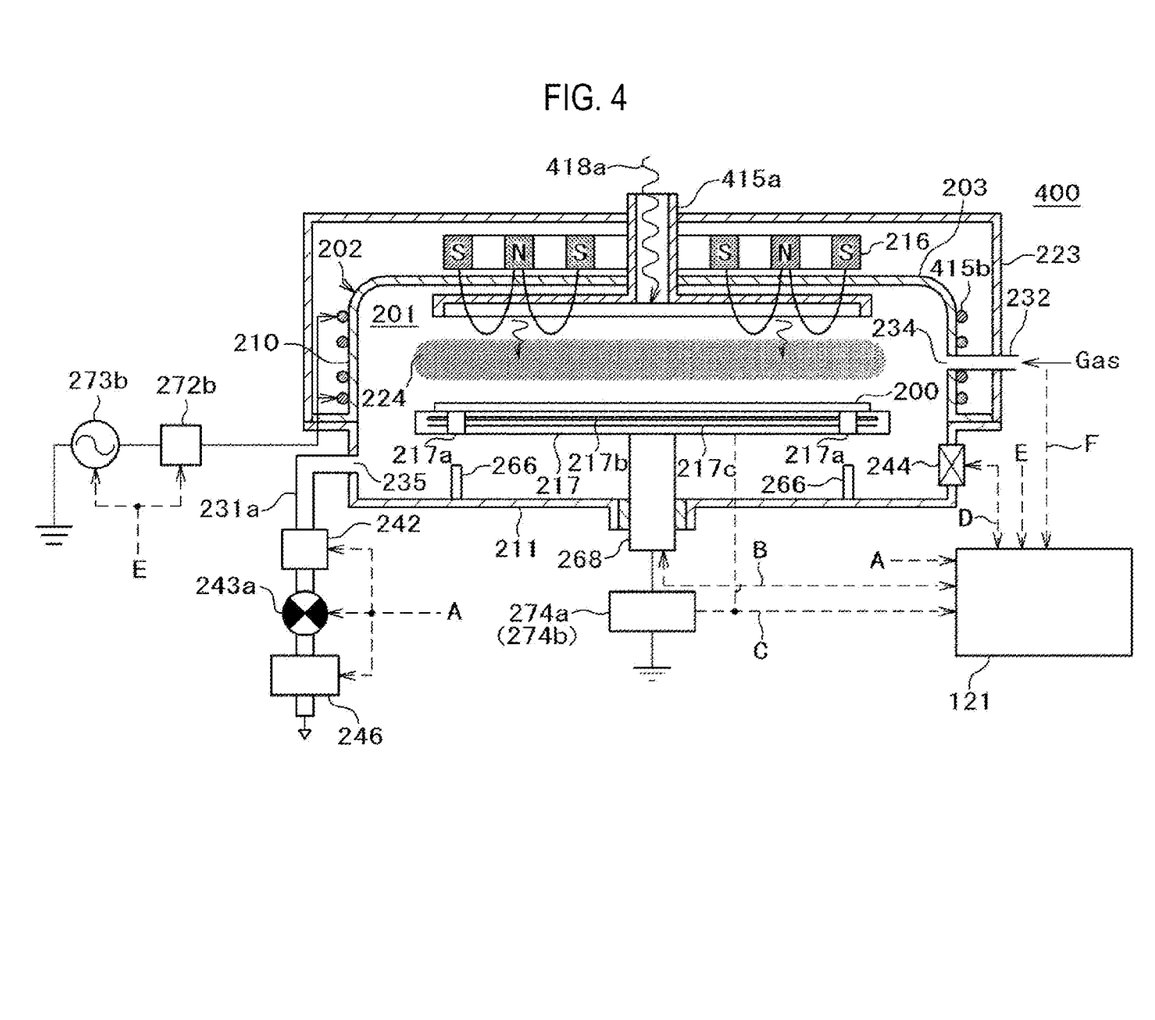
FIG. 4 is a vertical section view of an ECR plasma processing apparatus according to a third embodiment of the present disclosure.

Next, a third embodiment will be described with reference to FIG. 4. FIG. 4 shows an ECR plasma processing apparatus 400 serving as a substrate processing apparatus according to a third embodiment of the present disclosure. The components having the same functions as those of the first embodiment will be designated by like reference symbols with no detailed description made on the configurations of the third embodiment. The gas supply unit is not shown in FIG. 4. The ECR plasma processing apparatus 400 according to the third embodiment includes an impedance matching box 272b, a high-frequency power source 273b, a microwave introduction pipe 415a and an induction coil 415b, which are configured to supply microwaves and generate plasma. The microwave introduction pipe 415a is installed on the ceiling wall of the processing vessel 203. The induction coil 415b is installed on the outer surface of the outer circumferential wall of the processing vessel 203.

In the preprocessing and the main processing according to the third embodiment, a process gas containing hydrogen atoms and nitrogen atoms is supplied from the gas supply pipe 232 into the processing chamber 201 via the gas inlet 234. Before and after the gas supply, microwaves 418a are introduced into the microwave introduction pipe 415a and are irradiated toward the processing chamber 201. The process gas is excited in a plasma state by the microwaves 418a and the high-frequency electric power supplied from the induction coil 415b. This makes it possible to generate active species. For example, variable frequency microwaves (VFM) or fixed frequency microwaves (FFM) can be used as the microwaves 418a. In the third embodiment, the dummy wafer processing of the present disclosure as preprocessing is performed before performing, in the main processing, the nitriding of the oxide film formed on the product wafer.

In addition, the gas introduced into the processing chamber can be excited by the irradiation of ultraviolet rays or laser beams, to thereby perform dummy wafer processing of the present disclosure as preprocessing before performing, in the main processing, the nitriding of the oxide film formed on the product wafer. In these cases, the gas activity is weaker than in the plasma processing. Therefore, the time required in the dummy wafer processing becomes longer than dummy wafer processing time in the plasma processing. In the event that the gas introduced into the processing chamber is excited by thermal energy using a heating device such as an RTP (Rapid Thermal Processing) apparatus or the like, the adhering amount of oxygen is reduced because the entirety of the processing chamber or the member existing within the processing chamber is heated to a high temperature. Therefore, this method is more disadvantageous than the plasma processing.

The present disclosure is not limited to the respective embodiments described above. It goes without saying that the present disclosure can be modified in many different forms without departing from the spirit thereof. In the respective embodiments described above, description has been made on a case where the processing is performed with respect to a wafer. Alternatively, the object to be processed may be a photo mask, a printed wiring substrate, a liquid crystal panel, a compact disk or a magnetic disk.

At least the following configurations are included in the subject specification.

A first configuration is directed to a substrate processing method including: a main processing process for nitriding a product substrate; and a preprocessing process for nitriding a dummy substrate which is different from the product substrate, the preprocessing process being performed prior to the main processing process, wherein the main processing process includes: loading a product substrate having an oxide film formed thereon into a processing chamber; supplying a process gas containing nitrogen atoms into the processing chamber to keep the inside of the processing chamber at a first pressure; keeping the product substrate loaded into the processing chamber at a first electric potential; converting the process gas supplied into the processing chamber to plasma in a state that the inside of the processing chamber is kept at the first pressure with the product substrate kept at the first electric potential, thereby nitriding the oxide film formed on the product substrate; evacuating the inside of the processing chamber; and unloading the nitrided product substrate from the processing chamber, and wherein the preprocessing process includes: loading a dummy substrate having an oxide film formed thereon into the processing chamber; supplying a process gas containing nitrogen atoms into the processing chamber to keep the inside of the processing chamber at a second pressure lower than the first pressure; keeping the dummy substrate loaded into the processing chamber at a second electric potential lower than the first electric potential; converting the process gas supplied into the processing chamber to plasma in a state that the inside of the processing chamber is kept at the second pressure with the dummy substrate kept at the second electric potential, thereby nitriding the oxide film formed on the dummy substrate; evacuating the inside of the processing chamber; and unloading the nitrided dummy substrate from the processing chamber.

A second configuration is directed to the substrate processing method of the first configuration, wherein the preprocessing process is performed when the atmosphere within the processing chamber is kept at an oxygen concentration equal to or larger than a specified value.

A third configuration is directed to the substrate processing method of the first configuration or the second configuration, wherein the time required in nitriding the oxide film formed on the dummy substrate in the preprocessing process is longer than the time required in nitriding the oxide film formed on the product substrate in the main processing process.

A fourth configuration is directed to a substrate processing apparatus including: a processing chamber configured to accommodate therein a target substrate having an oxide film formed thereon and nitride the oxide film formed on the target substrate; a gas supply unit configured to supply a process gas used in the nitriding into the processing chamber; a gas exhaust unit configured to discharge a gas existing within the processing chamber; a plasma generating unit configured to convert the process gas supplied into the processing chamber to plasma; a substrate potential changing unit configured to change an electric potential of the target substrate loaded into the processing chamber; and a control unit configured to control the gas supply unit, the gas exhaust unit, the plasma generating unit and the substrate potential changing unit, wherein the control unit is configured to perform: a first target substrate processing process including: loading a target substrate having an oxide film formed thereon into the processing chamber; supplying the process gas from the gas supply unit into the processing chamber to keep the inside of the processing chamber at a first pressure; keeping the target substrate loaded into the processing chamber at a first electric potential by the substrate potential changing unit; converting the process gas supplied into the processing chamber to plasma by the plasma generating unit in a state that the inside of the processing chamber is kept at the first pressure with the target substrate kept at the first electric potential, thereby nitriding the oxide film formed on the target substrate; discharging the gas existing within the processing chamber by the gas exhaust unit; and then unloading the target substrate from the processing chamber; and a second target substrate processing process including: loading a target substrate having an oxide film formed thereon into the processing chamber; supplying the process gas from the gas supply unit into the processing chamber to keep the inside of the processing chamber at a second pressure lower than the first pressure; keeping the target substrate loaded into the processing chamber at a second electric potential lower than the first electric potential by the substrate potential changing unit; converting the process gas supplied into the processing chamber to plasma by the plasma generating unit in a state that the inside of the processing chamber is kept at the second pressure with the target substrate kept at the second electric potential, thereby nitriding the oxide film formed on the target substrate; discharging the gas existing within the processing chamber by the gas exhaust unit; and then unloading the target substrate from the processing chamber, the control unit being configured to perform the second target substrate processing process prior to the first target substrate processing process.

A fifth configuration is directed to a semiconductor device manufacturing method including; a main processing process for nitriding a product substrate; and a reprocessing process for nitriding a dummy substrate which is different from the product substrate, the preprocessing process being performed prior to the main processing process, wherein the main processing process includes: loading a product substrate having an oxide film formed thereon into a processing chamber; supplying a process gas containing nitrogen atoms into the processing chamber to keep the inside of the processing chamber at a first pressure; keeping the product substrate loaded into the processing chamber at a first electric potential; converting the process gas supplied into the processing chamber to plasma in a state that the inside of the processing chamber is kept at the first pressure with the product substrate kept at the first electric potential, thereby nitriding the oxide film formed on the product substrate; evacuating the inside of the processing chamber; and unloading the nitrided product substrate from the processing chamber, and wherein the preprocessing process includes: loading a dummy substrate having an oxide film formed thereon into the processing chamber; supplying a process gas containing nitrogen atoms into the processing chamber to keep the inside of the processing chamber at a second pressure lower than the first pressure; keeping the dummy substrate loaded into the processing chamber at a second electric potential lower than the first electric potential; converting the process gas supplied into the processing chamber to plasma in a state that the inside of the processing chamber is kept at the second pressure with the dummy substrate kept at the second electric potential, thereby nitriding the oxide film formed on the dummy substrate; evacuating the inside of the processing chamber; and unloading the nitrided dummy substrate from the processing chamber.

A sixth configuration is directed to a substrate processing method including; first and second processing processes for nitriding a target substrate, the second processing process being performed prior to the first processing process, wherein the first processing process includes: loading a target substrate having an oxide film formed thereon into a processing chamber; supplying a process gas containing nitrogen atoms into the processing chamber to keep the inside of the processing chamber at a first pressure; keeping the target substrate loaded into the processing chamber at a first electric potential; converting the process gas supplied into the processing chamber to plasma in a state that the inside of the processing chamber is kept at the first pressure with the product substrate kept at the first electric potential, thereby nitriding the oxide film formed on the target substrate; evacuating the inside of the processing chamber; and unloading the nitrided target substrate from the processing chamber, and wherein the second processing process includes: loading a target substrate having an oxide film formed thereon into the processing chamber; supplying a process gas containing nitrogen atoms into the processing chamber to keep the inside of the processing chamber at a second pressure lower than the first pressure; keeping the target substrate loaded into the processing chamber at a second electric potential lower than the first electric potential; converting the process gas supplied into the processing chamber to plasma in a state that the inside of the processing chamber is kept at the second pressure with the target substrate kept at the second electric potential, thereby nitriding the oxide film formed on the target substrate; evacuating the inside of the processing chamber; and unloading the nitrided target substrate from the processing chamber.

A seventh configuration is directed to a substrate processing method including: a main processing process for nitriding a product substrate; and a preprocessing process for nitriding a dummy substrate which is different from the product substrate, the preprocessing process being performed prior to the main processing process, wherein the main processing process includes: loading a product substrate having an oxide film formed thereon into a processing chamber; supplying a process gas containing nitrogen atoms into the processing chamber to keep the inside of the processing chamber at a first pressure; keeping the product substrate loaded into the processing chamber at a first electric potential; converting the process gas supplied into the processing chamber to plasma with first electric power in a state that the inside of the processing chamber is kept at the first pressure with the product substrate kept at the first electric potential, thereby nitriding the oxide film formed on the product substrate for a first time period; evacuating the inside of the processing chamber; and unloading the nitrided product substrate from the processing chamber, and wherein the preprocessing process includes: loading a dummy substrate having an oxide film formed thereon into the processing chamber; supplying a process gas containing nitrogen atoms into the processing chamber to keep the inside of the processing chamber at a second pressure; keeping the dummy substrate loaded into the processing chamber at a second electric potential; converting the process gas supplied into the processing chamber to plasma with second electric power in a state that the inside of the processing chamber is kept at the second pressure with the dummy substrate kept at the second electric potential, thereby nitriding the oxide film formed on the dummy substrate for a second time period, evacuating the inside of the processing chamber; and unloading the nitrided dummy substrate from the processing chamber, the second pressure being lower than the first pressure, the second electric potential being lower than the first electric potential, the second electric power being higher than the first electric power, or the second time period being longer than the first time period.

An eighth configuration is directed to a substrate processing apparatus including: a processing chamber configured to accommodate therein a target substrate having an oxide film formed thereon and nitriding the oxide film formed on the target substrate;
a gas supply unit configured to supply a process gas used in the nitriding into the processing chamber; a gas exhaust unit configured to discharge a gas existing within the processing chamber; a plasma generating unit configured to convert the process gas supplied into the processing chamber to plasma; a substrate potential changing unit configured to change an electric potential of the target substrate loaded into the processing chamber; and a control unit configured to control the gas supply unit, the gas exhaust unit, the plasma generating unit and the substrate potential changing unit, wherein the control unit is configured to perform: a first target substrate processing process including: loading a target substrate having an oxide film formed thereon into the processing chamber; supplying the process gas from the gas supply unit into the processing chamber to keep the inside of the processing chamber at a first pressure; keeping the target substrate loaded into the processing chamber at a first electric potential by the substrate potential changing unit; converting the process gas supplied into the processing chamber to plasma with first electric power by the plasma generating unit in a state that the inside of the processing chamber is kept at the first pressure with the target substrate kept at the first electric potential, thereby nitriding the oxide film formed on the target substrate for a first time period; discharging the gas existing within the processing chamber by the gas exhaust unit; and then unloading the target substrate from the processing chamber; and a second target substrate processing process including: loading a target substrate having an oxide film formed thereon into the processing chamber; supplying the process gas from the gas supply unit into the processing chamber to keep the inside of the processing chamber at a second pressure; keeping the target substrate loaded into the processing chamber at a second electric potential by the substrate potential changing unit; converting the process gas supplied into the processing chamber to plasma with second electric power by the plasma generating unit in a state that the inside of the processing chamber is kept at the second pressure with the target substrate kept at the second electric potential, thereby nitriding the oxide film formed on the target substrate for a second time period; discharging the gas existing within the processing chamber by the gas exhaust unit; and then unloading the target substrate from the processing chamber, and the control unit being configured to perform the second target substrate processing process prior to the first target substrate processing process, and the control unit being configured to perform the first target substrate processing process and the second target substrate processing process in a state that the second pressure is lower than the first pressure, the second electric potential is lower than the first electric potential, the second electric power is higher than the first electric power, or the second time period is longer than the first time period.

A ninth configuration is directed to a recording medium configured to record thereon a program for executing the substrate processing method of any one of the first configuration, the second configuration, the third configuration, the sixth configuration and the seventh configuration.

A tenth configuration is directed to a recording medium configured to record thereon a program for executing the semiconductor device manufacturing method of the fifth configuration.

If the substrate processing method and the substrate processing apparatus are configured as above, it is possible to reduce the number of the dummy substrates required in the preprocessing process as compared with the related art.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, the method comprising:
   loading a first substrate having an oxide film formed on the first substrate into a processing chamber, the first substrate supported by a susceptor;
   supplying a process gas containing nitrogen atoms to the first substrate;
   performing a preprocessing in which the process gas is excited in a state that a pressure within the processing chamber is at a first pressure and an electric potential of the first substrate is kept at a first electric potential by controlling a bias voltage of the susceptor;
   loading a second substrate having an oxide film formed on the second substrate into the processing chamber, the second substrate supported by the susceptor;
   supplying the processing gas to the second substrate; and
   performing a main processing in which the process gas is excited in a state that the pressure within the processing chamber is at a second pressure and an electric potential of the second substrate is kept at a second electric potential by controlling the bias voltage of the susceptor,
   wherein the first pressure is lower than the second pressure and the first electric potential is greater than the second electric potential to facilitate oxygen adhering to one or more processing chamber surfaces, and
   wherein the first substrate is a dummy substrate and the second substrate is a processing substrate.

2. The method of claim 1, wherein a time required in nitriding the oxide film formed on the first substrate in the preprocessing is longer than a time required in nitriding the oxide film formed on the second substrate in the main processing.

3. A substrate processing apparatus, comprising:
   a processing chamber configured to load a first substrate having an oxide film formed on the first substrate or a second substrate having an oxide film formed on the second substrate, and including a susceptor, which supports the first substrate or the second substrate, installed in the processing chamber;
   a gas supply unit configured to supply a nitrogen-containing process gas to the each of the first and second substrates loaded in the processing chamber;
   a plasma generating unit configured to excite the process gas;
   a substrate potential changing unit located within the susceptor, and configured to change an electric potential of each of the first and second substrates; and
   a control unit configured to control the gas supply unit, the plasma generating unit and the substrate potential changing unit so as to perform: a preprocessing in which the process gas is excited in a state that an inside of the processing chamber is at a first pressure and the electric potential of the first substrate is kept at a first electric potential by controlling the bias voltage of the susceptor; and a main processing in which the process gas is excited in a state that the inside of the processing chamber is at a second pressure and the electric potential of the second substrate is kept at a second electric potential,
   wherein the first pressure is lower than the second pressure and the first electric potential is greater than the second electric potential to facilitate oxygen adhering to one or more processing chamber surfaces, and
   wherein the first substrate is a dummy substrate and the second substrate is a processing substrate.

4. The apparatus of claim 3, wherein the control unit is configured to control a time required in exciting the process gas in the preprocessing to be longer than a time required in exciting the process gas in the main processing.

5. The method of claim 1, wherein the process gas is excited in the preprocessing with a first electric power and the process gas is excited in the main processing with a second electric power, the first electric power being higher than the second electric power.

6. The method of claim 1, wherein the process gas comprises a mixture of $N_2$ gas and $H_2$ gas.

* * * * *